United States Patent

Bonora et al.

[19]

[11] Patent Number: 5,944,475
[45] Date of Patent: Aug. 31, 1999

[54] ROTATED, ORTHOGONAL LOAD COMPATIBLE FRONT-OPENING INTERFACE

[75] Inventors: Anthony C. Bonora, Menlo Park, Calif.; William J. Fosnight, Austin, Tex.; Raymond S. Martin, San Jose, Calif.

[73] Assignee: Asyst Technologies, Inc., Fremont, Calif.

[21] Appl. No.: 08/730,484

[22] Filed: Oct. 11, 1996

[51] Int. Cl.$^6$ .................................................. B65G 49/07
[52] U.S. Cl. ........................... 414/754; 414/222; 414/940
[58] Field of Search .................... 414/937, 940, 414/589, 590, 754, 217, 222

[56] References Cited

U.S. PATENT DOCUMENTS

| | | | |
|---|---|---|---|
| 4,532,970 | 8/1985 | Tullis et al. | 414/217 |
| 4,534,389 | 8/1985 | Tullis | 414/292 |
| 4,995,430 | 2/1991 | Bonora et al. | 414/217 |
| 5,443,348 | 8/1995 | Biche et al. | 414/940 |
| 5,525,024 | 6/1996 | Freerks et al. | 414/940 |
| 5,664,926 | 9/1997 | Sussman et al. | 414/940 |
| 5,709,519 | 1/1998 | Uehara et al. | 414/940 |

*Primary Examiner*—James W. Keenan
*Assistant Examiner*—Gregory A. Morse
*Attorney, Agent, or Firm*—Fliesler, Dubb, Meyer & Lovejoy

[57] ABSTRACT

A rotating and translating support assembly for receiving a front-opening pod according to applicable SEMI standards, and thereafter rotating the pod to a desired orientation. In this way, a number of pods may be received at interface ports of a minienvironment, and each of the pods and ports may be angled toward and aligned with a single, 2-arm pick and place robot. In a preferred embodiment of the present invention, the rotating and translating support assembly comprises a plate rotationally and translationally mounted on a shelf extending from the minienvironment adjacent to a front-opening interface port. In one embodiment, the support plate may be mounted on a shaft attached to a rotating assembly, such as for example a worm and drive gear. The rotating assembly may in turn be mounted on a translating assembly, such as for example a carriage riding on a lead screw. The rotating and translating assemblies may be controlled by a host computer, so as to rotate and translate a pod received on the support plate, to align the pod with an interface port which may be provided at an angle with respect to the front of the minienvironment.

19 Claims, 10 Drawing Sheets

(Line 4-4)

ROTATED, ORTHOGONAL LOAD COMPATIBLE FRONT-OPENING INTERFACE

CROSS-REFERENCE TO RELATED APPLICATION

The present application is related to the U.S. patent application Ser. No. 08/680,242, now abandoned, entitled "Cassette Support and Rotation Assembly for SMIF Applications," by Frederick T. Rosenquist, Anthony C. Bonora and Joshua T. Oen, which application is assigned to the owner of the present application, and which application is incorporated by reference herein in its entirety.

BACKGROUND OF THE INVENTION

1. Field of the Invention

The present invention relates to a transfer apparatus for use with standardized mechanical interface (SMIF) systems for facilitating semiconductor wafer fabrication, and in particular to a plate for supporting a side opening pod adjacent to a processing station, which plate is capable of controlled rotation and/or translation to position the pod at a desired orientation with respect to a side opening interface of the processing station.

2. Description of the Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, Solid State Technology, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.02 $\mu$m substantially interfere with 0.3 $\mu$m geometry semiconductor devices. The trend, of course, is to have smaller and smaller semiconductor processing geometries which today in research and development labs approach 0.2 $\mu$m and below. In the future, geometries will become smaller and smaller and hence smaller and smaller contamination particles become of interest, including molecular contaminants.

A SMIF system has three main components: (1) minimum volume, sealed pods used for storing and transporting wafer cassettes; (2) a minienvironment surrounding cassette ports and wafer processing areas of processing stations so that the environments inside the pods and minienvironment (upon being filled with clean air) become miniature clean spaces; and (3) a transfer mechanism to load/unload wafer cassettes and/or wafers from the sealed pods to the processing equipment without contamination of the wafers in the wafer cassette from external environments.

There are, in general, two types of SMIF pods. One type is a bottom opening pod comprising a pod door at the bottom of the pod which sealably mates with a pod top. A wafer-carrying cassette may be stored and transported within the pod, with the cassette resting on the pod door. A second type of pod is a side-opening pod comprising a container sealably mating with a vertically oriented door on a side of the pod. The container may house a wafer-carrying structure or cassette, or in the alternative, the container itself may be formed with a plurality of slots for supporting the wafers directly therein.

Conventionally, in order to transfer wafers from a side-opening SMIF pod to within a particular processing station, the pod is loaded onto a support plate which is supported adjacent a front-opening interface port of a minienvironment. The support plate is generally mounted on a shelf extending from an outer wall of the minienvironment. The pod and the interface port are designed so that the pod door overlies a port door covering the front-opening interface port, and an outer circumference of the pod container overlies a port plate surrounding the port door. Once located adjacent to the interface port, mechanisms within the interface port release and separate the pod door from the container. Thereafter, the pod door and port door are drawn into the minienvironment, and lowered or otherwise moved away from the access path to the wafers within the pod.

Once the pod doors are moved away, a wafer transfer mechanism within the minienvironment may transfer wafers between the pod and the processing station. One example of a wafer transfer mechanism is a 2-arm pick and place robot 20 shown in FIG. 1A. The 2-arm robot comprises a central shaft 22 mounted for rotation and translation along a z-axis concentric with the shaft axis of rotation. The robot further includes a first arm 24 affixed to an upper end of the shaft for rotation with the shaft, and a second arm 26 pivotally attached to the opposite end of the first arm. The pick and place robot further includes an end effector 28 for gripping individual wafers 30 from within a pod 32. The robot is controlled by a computer such that the end effector may be controllably moved about in three-dimensional space to access and transfer each of the wafers within the container. For applications where the side-opening pod includes a separate wafer-supporting cassette therein, the pick and place robot may further include a precision gripping mechanism mounted at the free end of the second arm for gripping and transferring the cassette between the pod and the processing chamber.

Another type of wafer transfer mechanism is a 3-arm, pick and place robot 34 such as shown in FIG. 1B. Such a robot operates similarly to the 2-arm robot 20, but includes three arms 36, 38, 40 operating with an end effector 28. In general, 2-arm pick and place robots are more desirable than 3-arm robots in that the 2-arm robots are more reliable and faster than the 3-arm robots.

The Semiconductor Equipment and Materials International ("SEMI") standard for the semiconductor industry with regard to positioning side-opening pods adjacent to processing and testing stations requires that a pod be located at a front of the processing/testing station with an edge of the pod provided parallel to the front of the station. This standard has been set so that a robotic handler may transfer a SMIF pod onto the translating support plate adjacent to a processing or testing station without requiring customization of the robotic handler or special manipulation of the SMIF pod. As explained hereinafter, such a requirement greatly limits the design flexibility with regard to transfer of wafers into the processing station, and requires a relatively large footprint for the transfer system.

Referring to FIG. 1A, there is shown a minienvironment 23 including a front-opening interface port 25, a 2-arm pick and place robot 20, and a processing station 42. A front-opening pod 32 is seated on a translating support plate (not shown) mounted in shelf 37 extending out from the minienvironment. A reference axis 21 corresponding to the axis of travel of end effector 28 in the 2-arm robot is designed to pass through the rotational center of the robot at shaft 22. Moreover, the axis of travel of the end effector 28 must be substantially perpendicular to the opening of the pod 32 in order for wafers 30 to be inserted or removed through the pod opening. Therefore, in applications transferring wafers from a single pod 32 into process chamber 42, a 2-arm robot may be used, but the robot must be placed directly in front of the pod.

A consequence of this alignment is that the front-opening interface port 25 must also be provided parallel to the front of the station, so that the pod can properly interface with the port. Additionally, processing and testing stations typically include other components in addition to the pick and place robot and translating support plate, such as for example keyboards, CRTs, and other electronic assemblies. The requirement that the pod be placed parallel to and at the front of a station severely limits the design flexibility of the processing station and controls. Further still, it is expensive to maintain clean room environments, and it is very important to minimize the space within the minienvironment 23. Having to locate the pick and place robot directly in front of the pod increases the depth (i.e., along reference axis 21) of the footprint of minienvironinent 23.

It is often desirable to process more than one pod at a processing station at the same time. In order to accomplish this, a 3-arm robot must be used (as shown in FIG. 1B), with an accompanying sacrifice in speed and reliability. Alternatively, a 2-arm robot may be mounted on a track (not shown) so that the robot can move back and forth parallel to the front of the minienvironment to access wafers from the two pods. Again, this requires a lot of time and adds another source of positional variance to the system. Moreover, as described above, such a system requires a relatively large footprint.

SUMMARY OF THE INVENTION

It is therefore an advantage of the present invention to provide a rotating and translating support assembly capable of receiving a side-opening pod in accordance with applicable SEMI standards, and thereafter rotating and/or translating the pod to a desired orientation.

It is a further advantage of the present invention to increase flexibility with respect to the location of an interface port, transfer robot, and controls therefor on and within a minienvironment.

It is another advantage of the present invention to provide a rotating and translating support assembly capable of rotating a side-opening pod, so that interface ports on a minienvironment do not have to be positioned parallel to the front of the minienvironment.

It is still another advantage of the present invention to provide a system wherein more than one pod and interface port may be angled inward toward a single 2-arm pick and place robot.

It is another advantage of the present invention to provide a system for transferring wafers from a front opening pod to a processing station in a minienvironment having a minimum overall footprint.

These and other advantages are provided by embodiments of the present invention, which in general relate to a rotating and translating support assembly for receiving a front-opening pod according to applicable SEMI standards, and thereafter rotating the pod to a desired orientation. In this way, a number of pods may be received at interface ports of a minienvironment, and each of the pods and ports may be angled toward and aligned with a single, 2-arm pick and place robot. In a preferred embodiment of the present invention, the rotating and translating support assembly comprises a plate rotationally and translationally mounted on a shelf extending from the minienvironment adjacent to a front-opening interface port. In one embodinent, the support plate may be mounted on a shaft attached to a rotating assembly, such as for example a worm and drive gear. The rotating assembly may in turn be mounted on a translating assembly, such as for example a carriage riding on a lead screw. The rotating and translating assemblies may be controlled by a host computer, so as to rotate and translate a pod received on the support plate to align the pod with an interface port which may be provided at an angle with respect to the front of the minienvironment.

BRIEF DESCRIPTION OF THE DRAWINGS

The invention will now be described with reference to the accompanying drawings in which.

DETAILED DESCRIPTION

The invention will now be described with reference to FIGS. 2–10C, which relate to a rotating and translating support assembly for receiving a front-opening pod according to applicable SEMI standards, and thereafter rotating the pod to a desired orientation. It is understood that the present invention may be utilized in a variety of semiconductor fabrication or testing processes where wafers are transferred between a front-opening pod and a processing station. Moreover, although the invention is described herein with respect to SMIF systems, it is understood that the present invention may operate with any of several wafer storage and transport devices. The terms "wafer" and "semiconductor wafer" as used herein refer to a wafer substrate as it may exist in any of the various stages of the semiconductor wafer fabrication process. Furthermore, it is not critical to the present invention that the wafer cassette include semiconductor wafers. It is contemplated that other substrates, such as for example flat panels or reticles, may be provided within the front-opening pod, which may then be rotated and/or translated according to the principles of the present invention as explained hereinafter.

Figure 2:
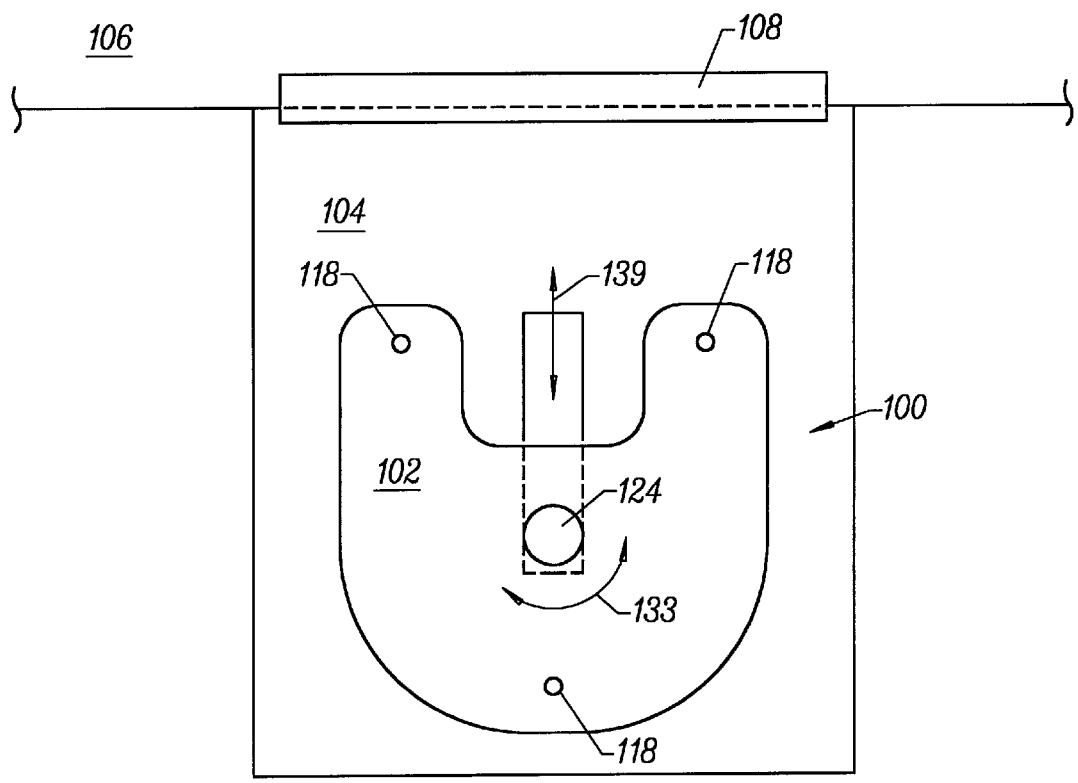
FIG. 2 is a top view of the rotating and translating support assembly according to embodiments of the present invention.
Figure 3:
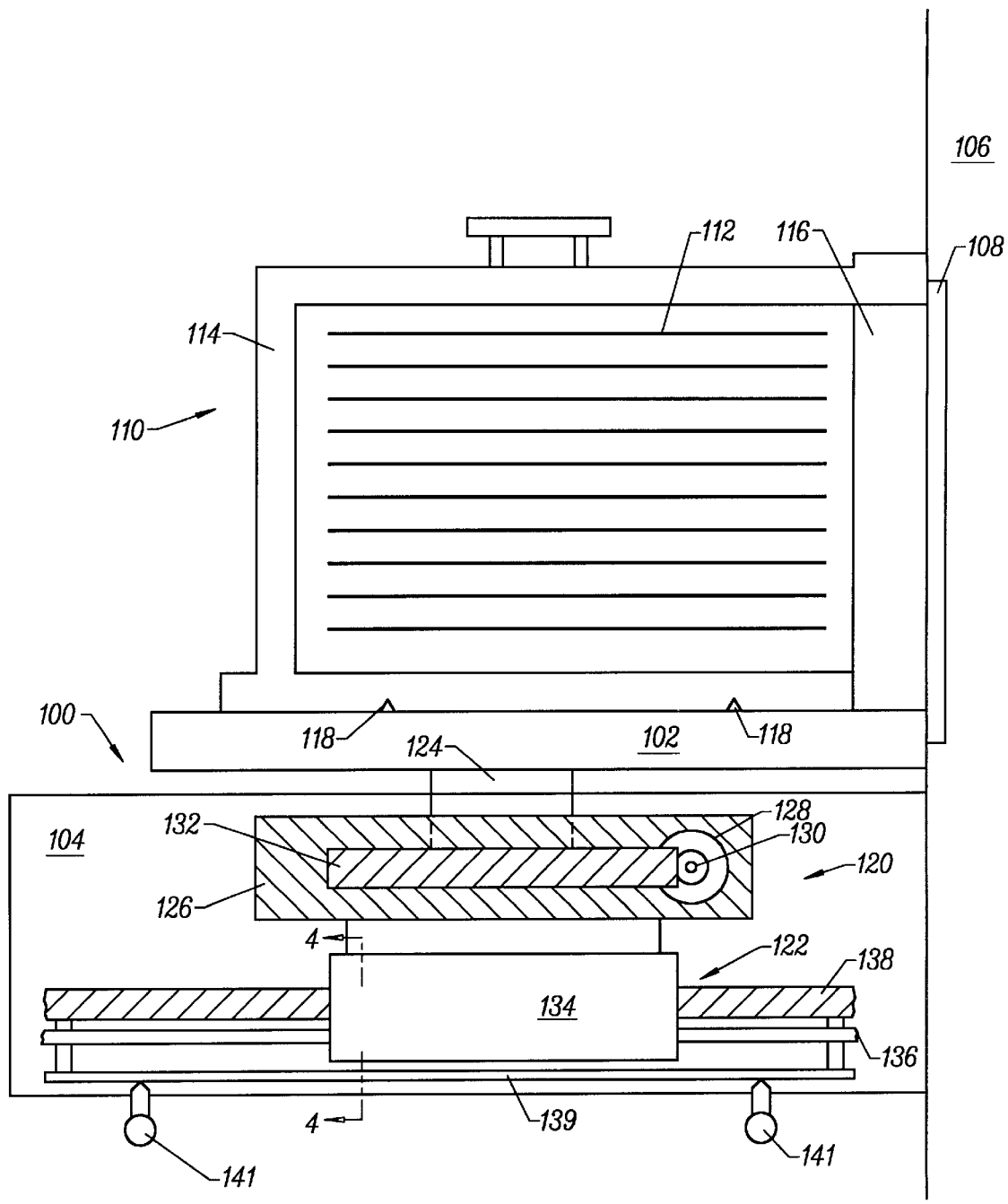
FIG. 3 is a side view of the rotating and translating support assembly according to embodiments of the present invention with a pod supported thereon.

Referring now to FIGS. 2–3, there is shown a rotating and translating support assembly 100, including a support plate 102 rotationally and translationally mounted on a shelf 104. The shelf 104 preferably is mounted on and extends from an outer surface of a minienvironment 106 adjacent to a front-opening port interface 108.

A front-opening SMIF pod 110 (not shown in FIG. 2) may be mounted on support plate 102, and thereafter interfaced to the minienvironment. Although not critical to the present invention, the pod 110 may include a plurality of shelves mounted to sides of the pod to support one or more wafers 112. Alternatively, the pod 110 may support a cassette (not shown), which cassette includes a plurality of shelves for supporting the wafers. The pod 110 is comprised of a container 114 sealably mating with a door 116 to define a static, controlled environment for wafers 112.

The SMIF pod 110 may be located on top of the support plate 102 either manually or by an automated transport system. A top surface of support plate 102 may include a plurality of protrusions 118 received within features on the bottom of the container 114 for ensuring that the SMIF pod 110 is always positioned in the same, predetermined rotational orientation on the support plate 102. It is understood that other structures may be used to properly align the SMIF pod on top of the support plate. For example, it is known to employ kinematic mounts for positioning a pod with respect to a support surface. Additionally, guide rails may be provided for assisting manual loading of the pod on the support plate. Where a cassette is provided within the pod 110, a similar mounting scheme may be employed between juxtaposed surfaces of the cassette and container to ensure proper alignment of the cassette within the container.

As described in the Background of the Invention section, once positioned on the support plate adjacent to the interface port, the pod door is separated from the container by means of a latch mechanism provided within the port door. Although not critical to the present invention, details relating to such a latch mechanism are described in U.S. Pat. No. 4,995,430, entitled "Sealable Transportable Container Having Improved Latch Mechanism", which application is assigned to the owner of the present application and is incorporated by reference in its entirety herein. Once the pod door and container are decoupled, the pod door and a port door covering the opening of the interface port 108 may be drawn into the minienvironment 106, and thereafter moved downward, or otherwise out of the way to provide an unobstructed transfer path for the wafers by a pick and place robot as described hereinafter. While the pod door 116 is within the mlnienvironment, the container 114 is preferably maintained in contact with the interface port 108 to prevent contaminants from entering into the opening in the interface port.

Referring specifically to FIG. 3, in addition to support plate 102, the rotating and translating assembly 110 additionally includes a rotation assembly 120, which assembly is in turn supported on a translation assembly 122. In a preferred embodiment of the present invention, rotation assembly 120 includes a shaft 124 fixedly mounted to an underside of the support plate 102. The shaft 124 is rotatably supported on bearings (not shown) within a housing 126 so that the shaft 124 and support plate 102 may rotate with respect to the housing 126. In a preferred embodiment, rotation assembly 120 further includes a rotation motor 128 mounted within housing 126 for rotating a drive gear 130 affixed to an end of the motor 128. Rotation motor 128 may be a conventional motor, such as a stepper or a servo motor with position and/or velocity feedback. The drive gear 130, in turn, meshes with and drives a worm gear 132 fixedly mounted to shaft 124. The motor 128 is preferably controlled by a host computer (not shown). Upon activation of the motor 128 by the host computer, the rotation assembly may rotate the support plate 102 through any angle, clockwise or counterclockwise, in the direction of arrow 133 on FIG. 2. The motor may be activated by the host computer upon input from an operator, or automatically upon positioning of the pod 110 upon support plate 102, which positioning may be automatically sensed by any number of conventional sensing systems.

Although a preferred embodiment of the rotation assembly 120 has been described above, those skilled in the art will appreciate that any number of known rotation mechanisms may be used to rotate the support plate 102 and container 114. Such mechanisms may include, but are not limited to, various gear trains, belts, chains, cams, all of which may be directly or indirectly driven by a motor to affect rotation of the plate 102. As a further alternative, the rotation assembly may comprise a rack and pinion driven by a pneumatic cylinder. Various other known rotation mechanisms may be substituted for those mentioned above in alternative embodiments of the invention.

Figure 1A:
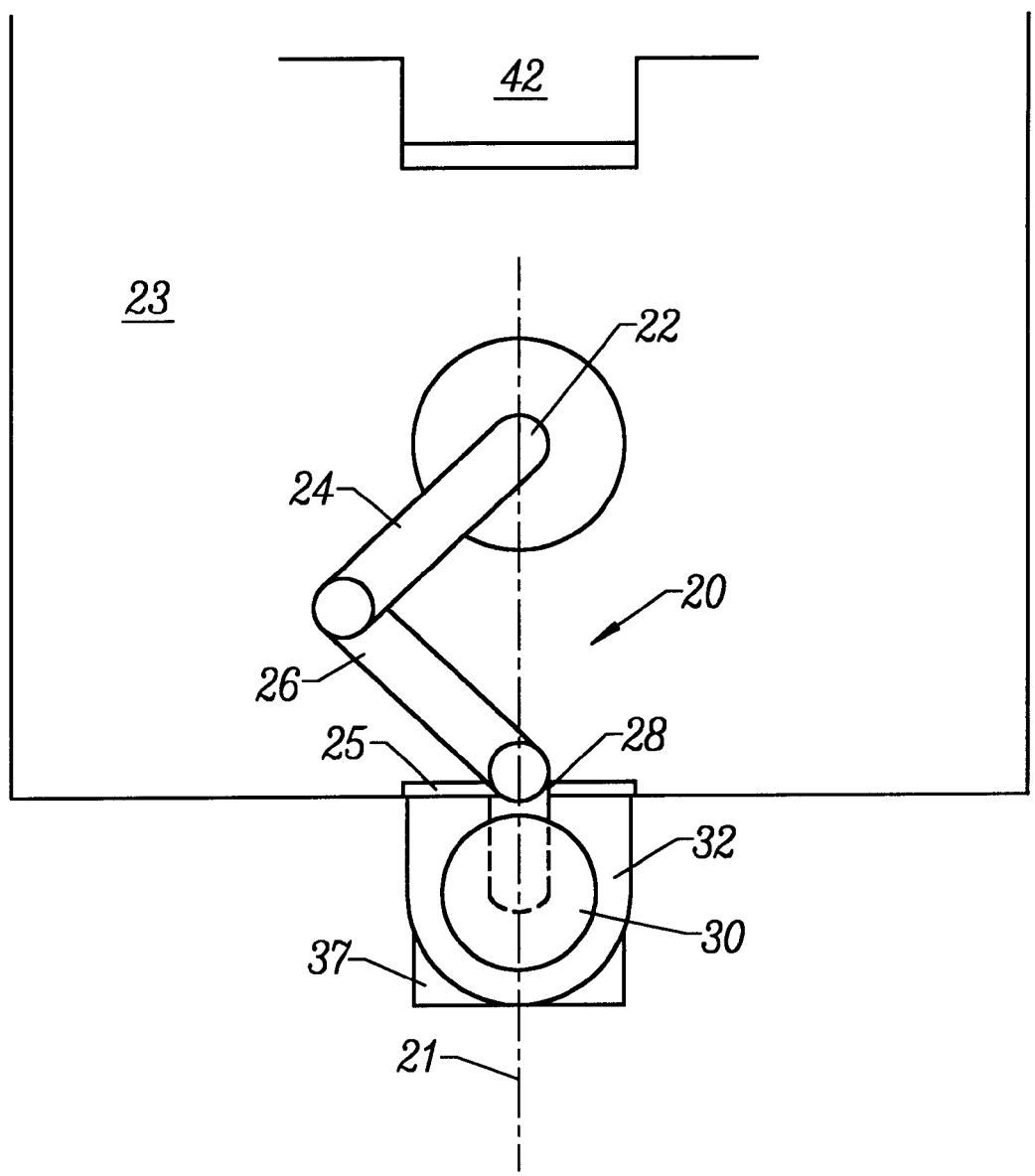
FIG. 1A is a top view of a conventional orientation required between a side-opening pod and a pick and place robot.
Figure 1B:
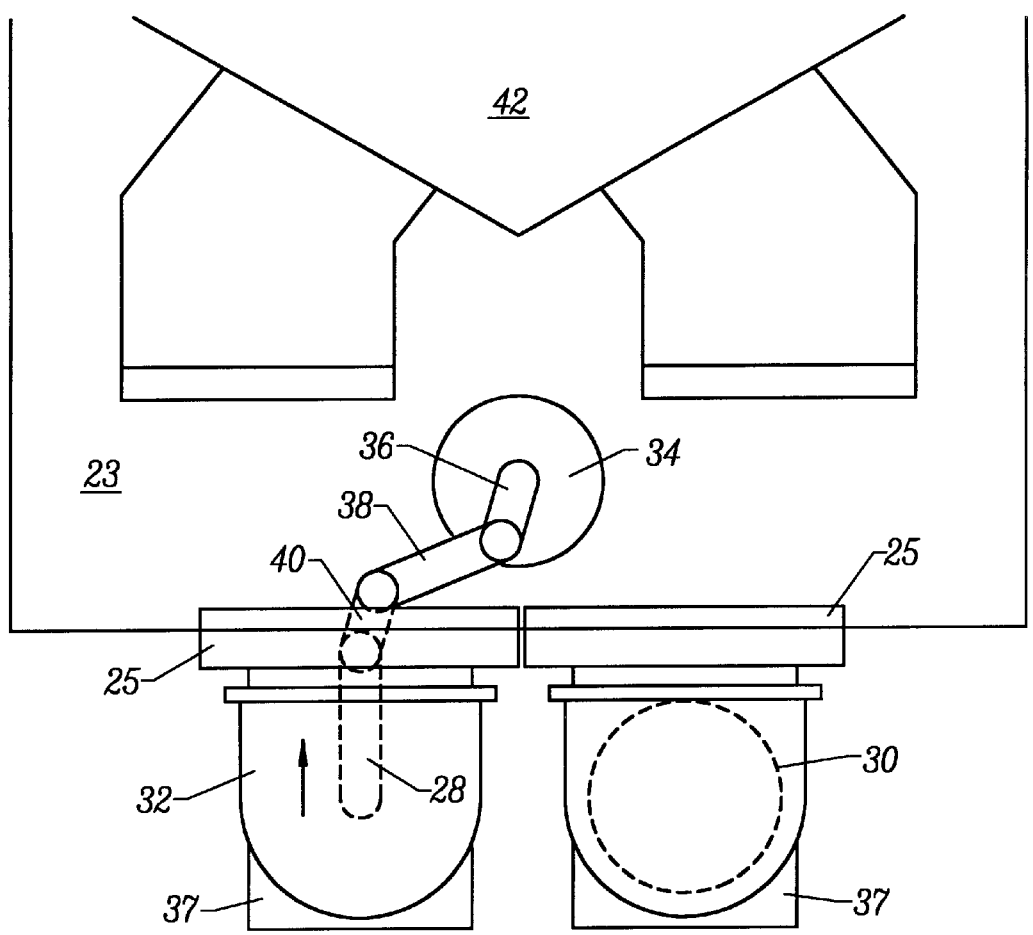
FIGURE 1B is a top view of a conventional orientation required between two side-opening pods and a pick and place robot.
Figure 4:
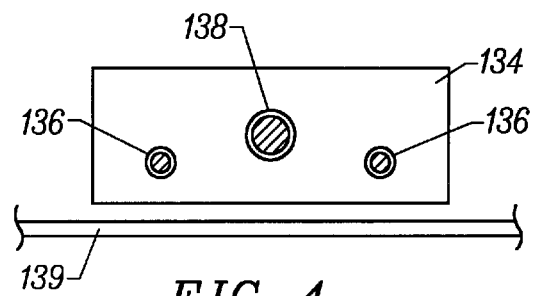
FIG. 4 is a cross-section view through line 4—4 in FIG. 3.

The rotation assembly 120 is preferably mounted on translation assembly 122, which is capable of translating the rotation assembly 120, support plate 102, and pod 110 toward and away from the interface port 108. In a preferred embodiment of the present invention, the translation assembly includes a carriage 134, to which the rotation assembly is fixedly mounted. As seen in FIGS. 3 and 4, carriage 134 rides on a pair of rails 136 and is threaded along a lead screw 138. Lead screw 138 may be rotated by a conventional motor (not shown) either within the shelf 104 or minienvironment 106. As would be appreciated by those skilled in the art, rotation of the lead screw by the motor will advance the carriage 134 either toward or away from the minienvironment 106 along arrow 139 on FIG. 2, depending on the direction of rotation of the lead screw. The motor which rotates the lead screw may be controlled by the host computer, and activated either by an operator command or automatically upon sensing the presence of the pod 110 on the support plate 102. The rails 136 provide additional stability to the translation assembly.

Although a preferred embodiment of the translation assembly 122 has been described above, those skilled in the art will appreciate that more or less than two rails and one lead screw may be used within the translation assembly 122. Moreover, any number of known translation mechanisms may be used to translate the translation assembly, support plate 102 and container 114. Such mechanisms may include, but are not limited to, pneumatic or hydraulic cylinders, various gear trains, belts, chains, cams, rack and pinion systems, all of which may be directly or indirectly driven by a motor to affect translation of the plate 102. Various other known translation mechanisms may be substituted for those mentioned above in alternative embodiments of the invention. The plate 102 may also include gripping mechanisms known in the art to secure the pod 110 on the plate 102 as the plate 102 rotates and/or translates.

It is further contemplated that the mounting point of the plate on the shaft 124 may be toward a front of the plate (i.e., nearest the interface port). In this way, when the translation assembly moves the plate away from the interface port, the plate 102 may extend out beyond the footprint of shelf 104 (i.e., to the left of shelf 104 as shown in FIG. 3). In another alternative embodiment of the present invention, there may be more than one support plate 102, stacked with respect to each other. The plates may have linear slides on their top and bottom surfaces, and include drive mechanisms such as belts, rack and pinion systems, pneumatic cylinders or the like for controllably allowing the plates to extend telescopically with respect to each other. In this way, the top plate supporting the pod 110 may extend out beyond the footprint of the shelf supporting each of the plates.

The rotating and translating assembly 100, including the rotation and translation assemblies, is mounted on a frame 139, which is in turn supported on the shelf 104. It is important that the plate 102 constantly support the pod 110 in a horizontal plane, such that the front end of the pod is flush against the interface port, even if the shelf 104 is not precisely perpendicular to the interface port. Therefore, embodiments of the present invention further include three support pins 141 sticking up through the bottom of the shelf 104 (only two are shown in FIG. 3). The frame is supported on the tops of the three pins. The pins are threaded through the shelf 104 such that the height to which each of the pins protrudes through the shelf may be adjusted by manually turning the pins. As the support plate 102 is supported on the frame 139 via the rotation and translation assemblies, the plane of the support plate may be adjusted to horizontal by turning one or more of the pins 141.

Figure 5:
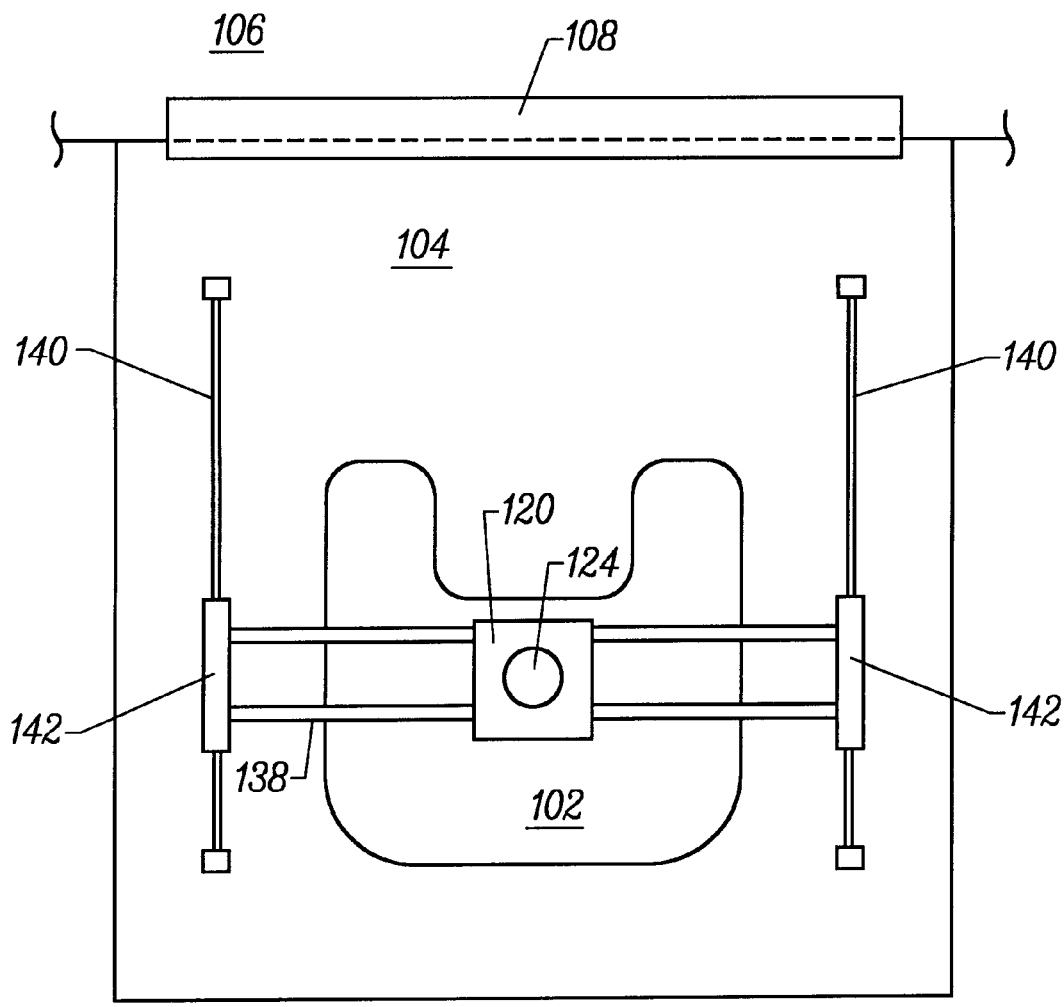
FIG. 5 is a top view of an alternative embodiment of the rotating and translating support assembly according to the present invention.

An alternative embodiment of the invention is shown in FIG. 5. Elements which perform their previously described functions are designated with like reference numerals. In the embodiment of FIG. 5, the rotation and translation assembly is capable of rotating the plate 102 as described above, and translating the plate 102 toward and away from the interface port 108 substantially as described above. Additionally, this embodiment is capable of translating the plate 102 in a direction substantially parallel to the front of minienvironment 106. An additional pair of lead screws 140 are provided substantially perpendicular to lead screw(s) 138, with the lead screw(s) 138 in turn riding on carriages 142 that are threaded around lead screws 140. It is additionally contemplated that the plate 102 may be eccentrically mounted to allow the plate to translate out beyond the footprint of the shelf 104.

Figure 6:
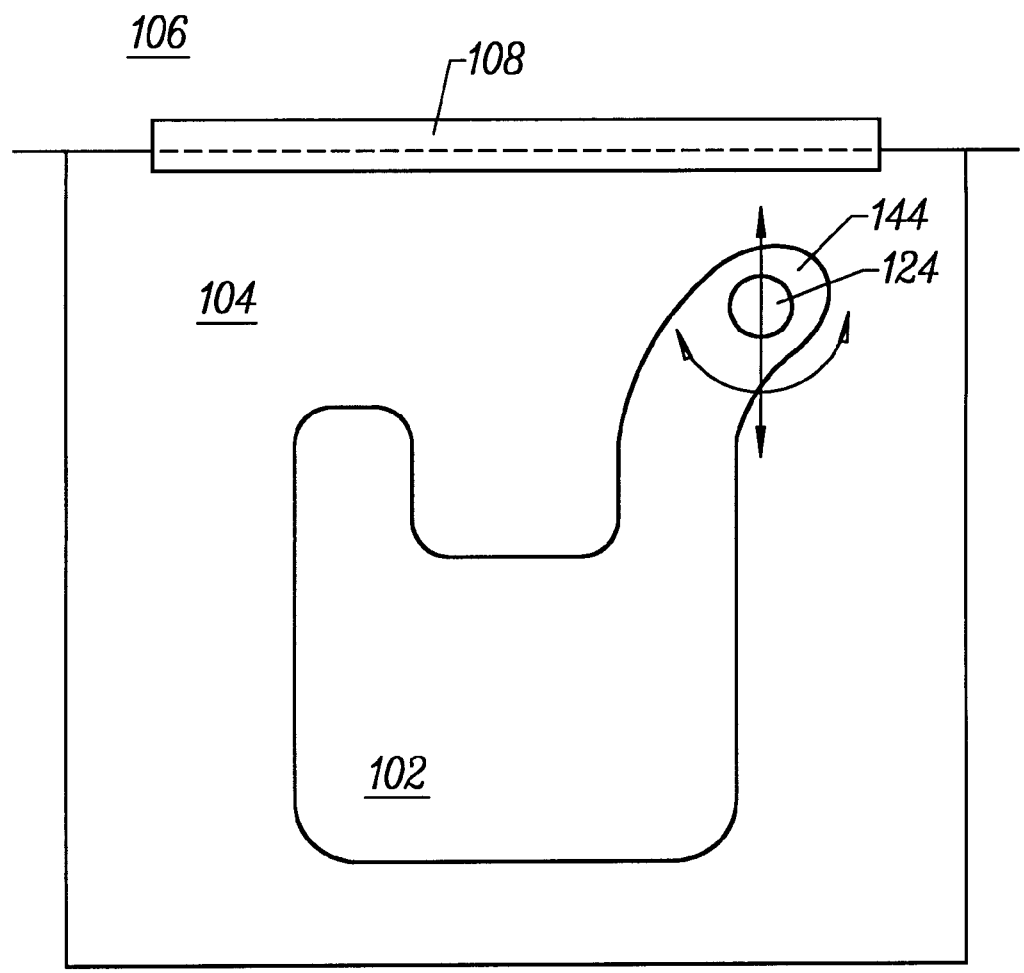
FIG. 6 is a top view of an alternative embodiment of the rotating and translating support assembly according to the present invention.

A further alternative embodiment of the present invention is shown in FIG. 6. In this embodiment, the plate 102 may be rotated by a rotation assembly 120 such as that described above, and/or a translation assembly 122 such as that described above. In the embodiment shown in FIG. 6, the plate 102 may be modified slightly so as to have an extension 144, and the shaft 124 may be fixedly mounted to plate 102 at the extension 144. In this manner, the plate may be controlled to pivot around shaft 124 eccentrically. The plate 102 may also be controlled in this embodiment to pivot outside of the footprint of the shelf 104. It is understood that the shaft 124 may be mounted at other points on plate 102 so as to pivot the plate 102 eccentrically. It is understood that the embodiments of the invention shown in FIGS. 3, 5 and 6 may be used in combination with each other embodiment.

Figure 7:
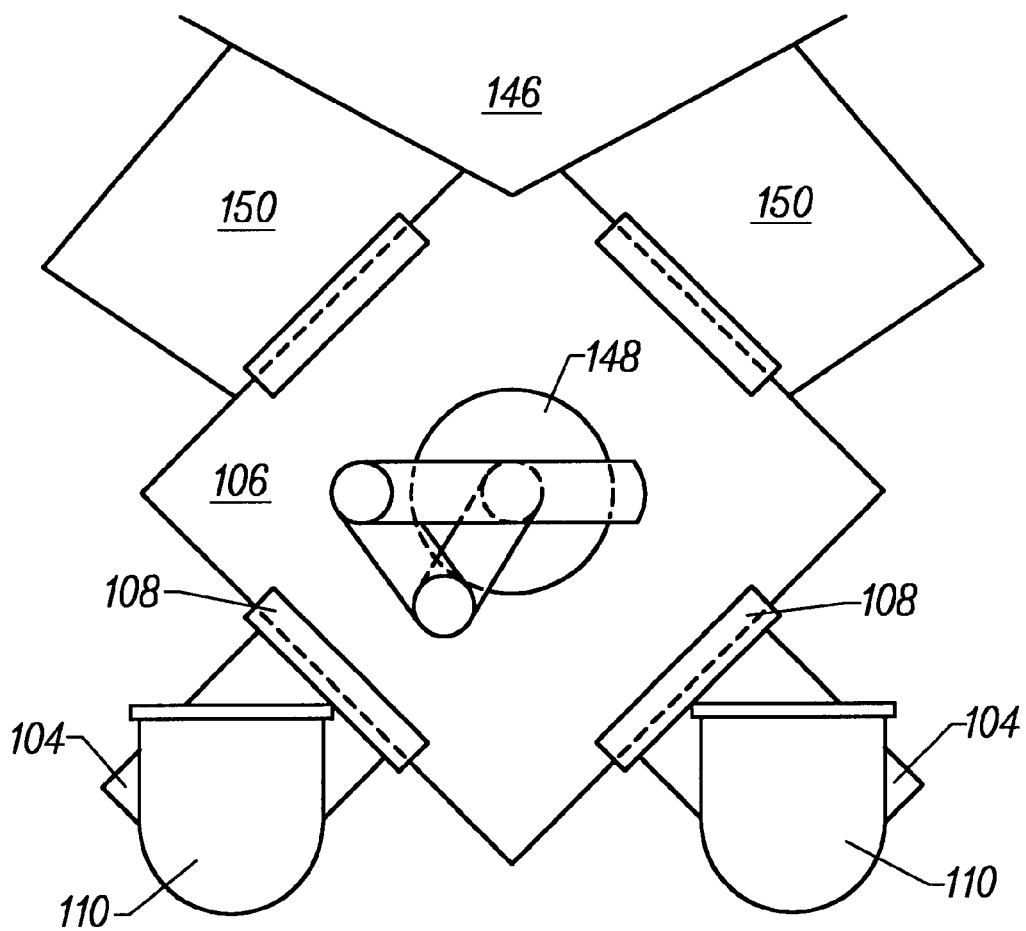
FIGS. 7–9 are top views of semiconductor fabrication processes utilizing embodiments of the present invention.
Figure 8:
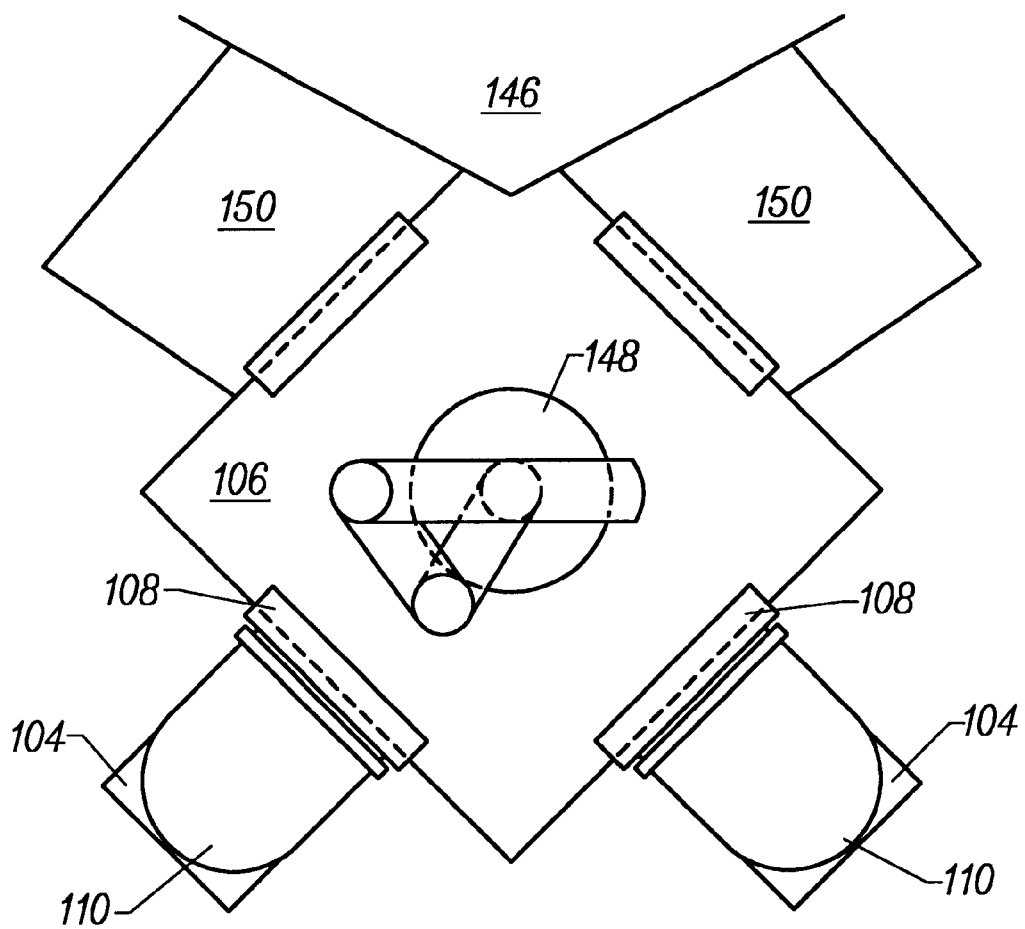

Referring now to FIGS. 7 and 8, an application of the present invention may be seen with respect to semiconductor processing station 146. The processing station is located adjacent to a minienvironment 106 including a 2-arm pick and place robot 148. The 2-arm pick and place robot may advantageously be utilized as a result of the present invention. However, it is understood that the wafer transfer mechanism is not part of the present invention, and various types of wafer transfer mechanisms may be used in conjunction with the present invention, including but not limited to, 2 and 3-arm pick and place robots, and selective compliance assembly robot arm (SCARA) type robots.

As described in the Background of the Invention section, pods 110 are generally brought to the minienvironment 106 in a predetermined orientation dictated by the SEMI standards. This initial position of the pods 110 is shown in FIG. 7. Thereafter, the rotating and translating assembly according to the present invention (not seen in FIGS. 7 and 8), is capable of rotating the pods independently to align the pods to their respective interface ports 108 as shown in FIG. 8. As described in the summary of the invention section, controllably altering the orientation of the pods 110 allows the interface ports 108 to be angled, and selectively located at advantageous locations around the periphery of the minienvironment 106. After a pod is aligned with an interface port, the robot 148 may transfer the wafers between the pods themselves and/or the pods and the processing station 146 via ports 150. For embodiments of the pods 110 including cassettes therein, the wafers and/or cassettes may be transferred between the pods and/or the processing station. Embodiments of the present invention may further include sensors (not shown) mounted in the rotating and translating assembly or pod, and the interface port, for properly rotating and translating the plate 102 to align the pod with the interface port. Alternatively, the angle of rotation and/or degree of translation may be stored in computer memory for each interface port, such that the host computer can affect the alignment of the pod and port each time a pod is located on a plate 102 at an interface port.

It is understood that the particular configuration of the overall fabrication system shown in FIGS. 7 and 8 are examples only, and that the present invention may be used to rotate and translate a front-opening pod in any process or test where the pod is initially brought to the process in a predetermined orientation which may advantageously be changed. Moreover, although the invention has been described thus far as applying to front-opening pods, it is understood that embodiments of the present invention may also be used with bottom-opening pods. For example, embodiments of the present application may be used in the device disclosed in currently pending U.S. patent application Ser. No. 08/730,643 entitled, "Load Port Opener," by Frederick T. Rosenquist, filed on the same date as the present application and owned by the owners of the present application, which application is incorporated by reference herein in its entirety. That application discloses a load port opener for lifting a pod top away from a pod base and a wafer-carrying cassette seated on the pod base. The load port opener includes an inner support plate on which the pod base and cassette are supported, which inner support plate may be configured to include the rotating and translating support assembly according to the present invention.

Figure 9:
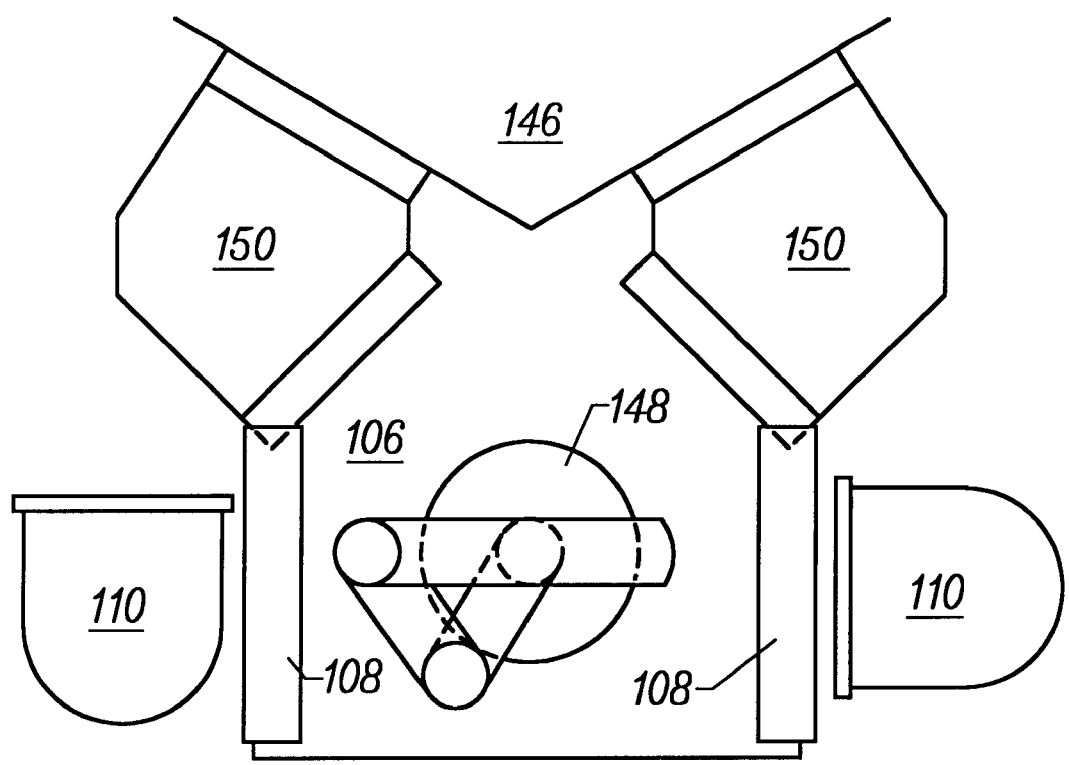

A further configuration of a processing station and minienvironment made possible by the present invention is shown in FIG. 9. In this configuration, the interface ports are provided to face each other. Such a configuration is an example where the overall footprint of the minienvironment may be minimized as a result of the flexibility provided by the present invention with regard to the location and orientation of the interface ports. As previously described, a pod 110 is initially brought to the station and seated in a predetermined position (shown by the pod on the left in FIG. 9), which position may thereafter be changed to align the opening of the pod with the interface port (shown by the pod on the right in FIG. 9). Although FIGS. 7–9 have shown a minienvironment equipped to accept two pods, it is understood that the present invention has equal application where the minienvironment may be set up for one pod, or more than two pods.

Figure 10A:
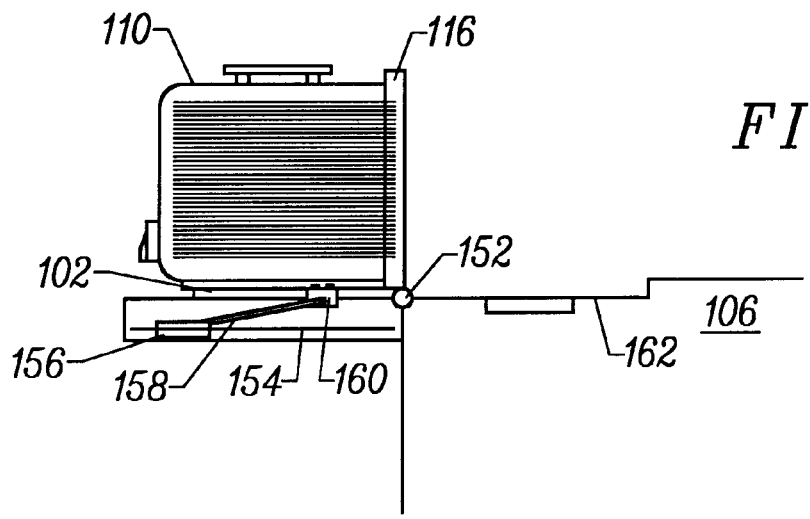
FIGS. 10–10C are sides views of an alternative embodiment of the rotating and translating support assembly according to the present invention.

Up to this point, the support plate 102 on which the pod 110 is loaded has been described as rotating about a z-axis. However, for certain applications, it is desirable to load a front-opening pod onto an interface port located on a top surface of a minienvironment. Therefore, according to a further embodiment of the invention, as opposed to rotating about a z-axis, the support plate may be capable of rotating about a y-axis, such as shown on FIGS. 10A–10C. According to this embodiment, a pod may be loaded on a support plate 102 as described above. As shown in FIG. 10A, the plate 102 may be mounted to a hinge 152 rotationally mounting the plate 102 to the minienviromnent 106.

Figure 10B:
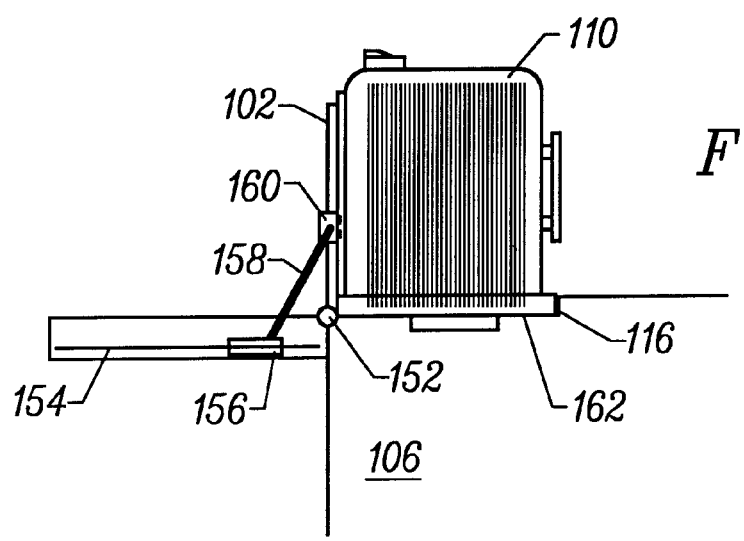
Figure 10C:
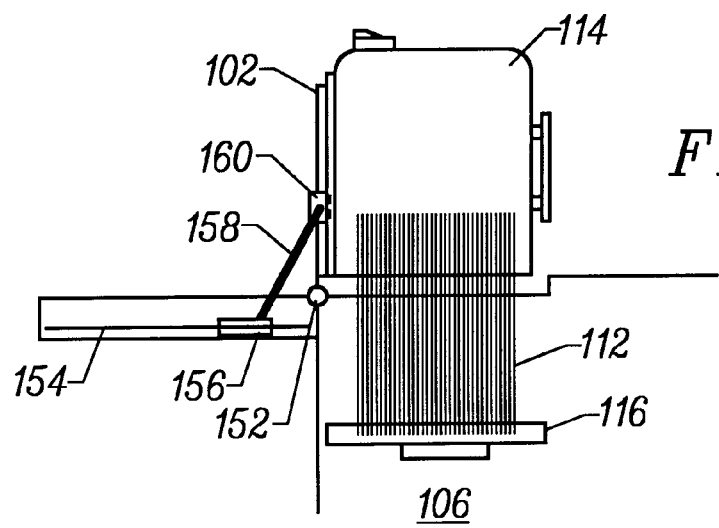

When wafers 112 are to be loaded from within the pod 110 into the minienvironment 106, a lead screw 154 is rotated to translate a carriage 156 threaded thereon. A connect member 158 has a first end pivotally mounted to the carriage 156, and a second end opposite the first end pivotally mounted to a bracket 160 affixed to an underside of the plate 102. As a result of the forward motion of the carriage 156 on the lead screw 154, a force is exerted by the connect member 158 on the bracket 160 to thereby pivot the plate 102 around the hinge 152 as shown in FIG. 10B. Once sufficiently pivoted, the pod door 116 mates with an interface port 162 mounted on a top side of the minienvironment 106. Thereafter, the pod door 116 is decoupled from the pod container 114, and the wafers 112 are lowered away from the container 116 as shown on FIG. 10C according to known technology. The plate 102 may also include gripping mechanisms known in the art to secure the pod 110 on the plate 102 as the plate 102 pivots. It is understood that other mechanical drive mechanisms may be used to affect pivoting of the plate 102 around hinge 152 upon location of the pod thereon.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A rotating and translating support assembly for interfacing a front-opening pod with a front-loading interface of a minienvironment, the front-loading interface provided at a variable angle with respect to a reference plane, the rotating and translating support assembly comprising:

a plate for receiving and supporting the pod;

a shaft fixedly mounted to an underside of said plate;

rotating means for rotating said shaft and said plate;

translating means, said rotating means being mounted on said translating means, said translating means capable of translating said rotating means and said plate in a horizontal plane;

adjustable support pins, said adjustable support pins located under said rotating means and said translating means for supporting said plate in a horizontal position; and control means for controlling said rotating means and said translating means to rotationally and translationally align the pod with the interface.

2. The rotating and translating support assembly as recited in claim 1, wherein said shaft is supported within a housing, said shaft and said plate rotating with respect to said housing.

3. The rotating and translating support assembly as recited in claim 2, wherein said shaft and said plate are rotated by a rotation motor mounted within said housing.

4. The rotating and translating support assembly as recited in claim 3, wherein said shaft includes a worm gear mounted thereon, said worm gear driven by a drive gear affixed to said rotation motor.

5. The rotating and translating support assembly as recited in claim 1, wherein said translating means includes a first carriage for mounting said rotating means thereon, said translating means further including a first lead screw for translating said first carriage.

6. The rotating and translating support assembly as recited in claim 5, wherein said first carriage is also mounted on rails for providing enhanced stability.

7. The rotating and translating support assembly as recited in claim 5, further comprising a second translating means for translating said plate in a direction substantially parallel to the front-loading interface.

8. The rotating and translating support assembly as recited in claim 7, wherein said second translating means includes a second lead screw substantially perpendicular to said first lead screw, said first lead screw mounted on said second lead screw by a second carriage.

9. The rotating and translating support assembly as recited in claim 1, wherein said shaft is eccentrically located on the underside of said plate.

10. The rotating and translating support assembly as recited in claim 1, further comprising an eccentric extension on said plate, said shaft being fixedly mounted on said eccentric extension.

11. The rotating and translating support assembly as recited in claim 1, wherein said plate includes a plurality of protrusions and said pod includes a plurality of features on a bottom of said pod, said protrusions and said features for mating and ensuring that said pod is positioned in a predetermined rotational orientation on said plate.

12. The rotating and translating support assembly as recited in claim 1, wherein said translating means moves said plate away from the front-loading interface when receiving said pod.

13. A translating and pivoting support assembly for interfacing a front-opening pod onto an interface port of a minienvironment, comprising:

a plate for receiving and supporting the pod, said plate being mounted to the minienvironment by a coupling;

a bracket fixedly mounted to an underside of said plate;

a pivoting means for pivoting said bracket and said plate about said coupling, said pivoting means including a connecting member having a first end pivotally mounted to said bracket;

a translating means having said pivoting means mounted thereon by a carriage such that said pivoting means includes a second end pivotally mounted to said carriage, said translating means for translating said bracket and said plate; and control means for controlling said pivoting means and said translating means to pivotally and transnationally align the pod with the interface.

14. The translating and pivoting support assembly as recited in claim 13, wherein said translating means includes a lead screw for translating said carriage.

15. A rotating and translating support assembly for interfacing a plurality of front-opening pods on a plurality of front-loading interfaces of a minienvironment, each of said plurality of front-loading interfaces provided at various angles around the periphery of the minienvironment with respect to a reference plane, the rotating and translating support assembly comprising:

a plurality of plates for receiving and supporting said plurality of front-opening pods, each of said plurality of plates including a plurality of protrusions and each of said plurality of front-opening pod including a plurality of features on their respective bottoms, said plurality of protrusions and said plurality of features for mating and ensuring that each of said plurality of front-opening pods is positioned in a predetermined rotational orientation on each of said plurality plates;

a plurality of shafts fixedly mounted to an underside of said plurality of plates;

a plurality of rotating means for rotating said plurality of shafts, said plurality of plates and said plurality of front-opening pods;

a plurality of translating means, said plurality of rotating means being mounted on said plurality of translating means, said plurality of translating means capable of translating said plurality of rotating means, said plurality of plate and said plurality of front-opening pods; and control means for controlling said plurality of rotating means and said plurality of translating means to rotationally and transnationally align independently each of said plurality of front-opening pods with each of said plurality of front-loading interfaces, respectively.

16. In a minienvironment having a front-loading interface provided at a variable angle with respect to a reference plane, a rotating and translating support assembly for interfacing a front-opening pod with the front-loading interface of the minienvironment, the rotating and translating support assembly comprising:

means for rotating said pod; and means for translating the pod in a horizontal plane, said means for translating including a carriage for mounting said means for rotating thereon, said means for translating further including a first lead screw for translating said carriage.

17. The rotating and translating support assembly as recited in claim 16, further comprising a plate mounted on a shelf of the front-loading interface for supporting the pod.

18. The rotating and translating support assembly as recited in claim 17, wherein said means for rotating is fixedly attached to an underside of said plate, said means for rotating the pod comprising a shaft rotatably supported within a housing, said shaft and said plate rotating with respect to said housing.

19. The rotating and translating support assembly as recited in claim 18, wherein said means for rotating further includes a worm gear mounted on said shaft, said worm gear being driven by a drive gear affixed on a motor.

* * * * *

UNITED STATES PATENT AND TRADEMARK OFFICE
CERTIFICATE OF CORRECTION

PATENT NO. : 5,944,475
DATED : Aug. 31, 1999
INVENTOR(S) : Anthony C. Bonora et al.

It is certified that error appears in the above-identified patent and that said Letters Patent is hereby corrected as shown below:

Col. 11, line 2: "transnationally" should be "translationally"

Col. 11, line 17: "pod" should be "pods"

Col. 11, line 32: "plate" should be "plates"

Col. 12, line 3: "transnationally" should be "translationally"

Signed and Sealed this

Seventh Day of March, 2000

Attest:

Q. TODD DICKINSON

Attesting Officer

Commissioner of Patents and Trademarks